United States Patent
Wang et al.

(10) Patent No.: US 10,330,712 B2
(45) Date of Patent: Jun. 25, 2019

(54) ORDER O(1) ALGORITHM FOR FIRST-PRINCIPLES CALCULATION OF TRANSIENT CURRENT THROUGH OPEN QUANTUM SYSTEMS

(71) Applicant: The University of Hong Kong, Hong Kong (CN)

(72) Inventors: Jian Wang, Hong Kong (CN); King Tai Cheung, Hong Kong (CN); Bin Fu, Sai Wan (HK); Zhizhou Yu, Zhejiang (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 15 days.

(21) Appl. No.: 15/424,537

(22) Filed: Feb. 3, 2017

(65) Prior Publication Data

US 2017/0219636 A1    Aug. 3, 2017

Related U.S. Application Data

(60) Provisional application No. 62/290,717, filed on Feb. 3, 2016.

(51) Int. Cl.
*G01R 19/25* (2006.01)
*G01R 19/00* (2006.01)
(Continued)

(52) U.S. Cl.
CPC ..... *G01R 19/2506* (2013.01); *G01R 19/0053* (2013.01); *G01R 19/04* (2013.01);
(Continued)

(58) Field of Classification Search
CPC .. G01R 15/205; G01R 15/207; G01R 33/091; G01R 19/0053; G01R 19/04; G01R 19/2506
See application file for complete search history.

(56) References Cited

U.S. PATENT DOCUMENTS

| 5,703,798 A | 12/1997 | Dhar |
| 2006/0132092 A1 | 6/2006 | Hoffman et al. |
| 2008/0222579 A1 | 9/2008 | Agarwal et al. |

OTHER PUBLICATIONS

N. S. Wingreen, A.-P. Jauho, and Y. Meir, Time-dependent transport through a mesoscopic structure, Phys. Rev. B, Sep. 15, 1993, vol. 48, No. 11, pp. 8487-8490.
(Continued)

*Primary Examiner* — Sujoy K Kundu
*Assistant Examiner* — L. Anderson
(74) *Attorney, Agent, or Firm* — Leason Ellis LLP

(57) ABSTRACT

A fast algorithm is used to study the transient behavior due to a step-like pulse applied to a nano-chip. This algorithm is carried out on a computer and consists of two parts: The algorithm I reduces the computational complexity to $T^0N^3$ for large systems as long as T<N; The algorithm II employs the fast multipole technique and achieves scaling $T^0N^3$ whenever $T<N^2$ beyond which it becomes $T \log_2 N$ for even longer time. Hence it is of order O(1) if $T<N^2$. Benchmark calculation has been done on graphene nanoribbons with $N=10^4$ and $T=10^8$. This new algorithm allows many large scale transient problems to be solved, including magnetic tunneling junctions and ferroelectric tunneling junctions that could not be achieved before, and using less computing capacity.

13 Claims, 5 Drawing Sheets
(5 of 5 Drawing Sheet(s) Filed in Color)

(51) Int. Cl.
G01R 19/04 (2006.01)
G01R 31/317 (2006.01)
B82Y 10/00 (2011.01)
B82Y 35/00 (2011.01)

(52) U.S. Cl.
CPC ........ *G01R 31/31702* (2013.01); *B82Y 10/00* (2013.01); *B82Y 35/00* (2013.01); *Y10S 977/734* (2013.01); *Y10S 977/842* (2013.01); *Y10S 977/88* (2013.01); *Y10S 977/936* (2013.01)

(56) References Cited

OTHER PUBLICATIONS

J. Wang, Time-dependent quantum transport theory from non-equilibrium Green's function approach, J. Comput. Electron., (2013) 12, pp. 343-355.
S. Kurth, G. Stefanucci, C.O. Almbladh, A. Rubio, and E. K. U. Gross, Time-dependent quantum transport: A practical scheme using density functional theory, Phys. Rev. B 72, pp. 035308-1-035308-13 (2005).
G. Stefanucci, S. Kurth, A. Rubio, and E. K. U. Gross, Time-dependent approach to electron pumping in open quantum systems, Phys. Rev. B 77, pp. 075339-1-075339-14, (2008).
Y. Zhu, J. Maciejko, T. Ji, H. Guo, and J. Wang, Time-dependent quantum transport: Direct analysis in the time domain, Phys. Rev. B 71, pp. 075317-1-075317-10, (2005).
J. Maciejko, J. Wang, and H. Guo, Time-dependent quantum transport far from equilibrium: An exact nonlinear response theory, Phys. Rev. B 74, pp. 085324-1-085324-23 (2006).
R. Tuovinen, E. Perfetto, G. Stefanucci, and R. van Leeuwen, Time-dependent Landauer-Büttiker formula: Application to transient dynamics in graphene nanoribbons, Phys. Rev. B 89, pp. 085131-1-085131-13 (2014).
R. Seoane Souto, R. Avriller, R. C. Monreal, A. Martin-Rodero, and A. Levy Yeyati, Transient dynamics and waiting time distribution of molecular junctions in the polaronic regime, Phys. Rev. B 92, pp. 125435-1-125435-10 (2015).
X. Zheng, F. Wang, C. Y. Yam, Y. Mo, and G. H. Chen, Time-dependent density-functional theory for open systems, Phys. Rev. B 75, pp. 195127-1-195127-16 (2007).
L. Zhang, Y. Xing, and J. Wang, First-principles investigation of transient dynamics of molecular devices, Phys. Rev. B 86, pp. 155438-1-155438-11 (2012).
B. Gaury, J. Weston, M. Santin, M. Houzet, C. Groth, and X. Waintal, Numerical simulations of time-resolved quantum electronics, Phys. Rep. 534, pp. 1-37 (2014).
M. Ridley, A. MacKinnon, and L. Kantorovich, Calculation of the current response in a nanojunction for an arbitrary time-dependent bias: application to the molecular wire, J. Phys.: Conf. Ser. 696, pp. 012017(1-11) (2016).
A. Croy and U. Saalmann, Propagation scheme for nonequilibrium dynamics of electron transport in nanoscale devices, Phys. Rev. B 80, pp. 245311-1-245311-10 (2009).
J. Weston and X. Waintal, Linear-scaling source-sink algorithm for simulating time-resolved quantum transport and superconductivity, Phys. Rev. B 93, pp. 134506-1-134506-12 (2016).
L. Zhang, J. Chen, and J. Wang, First-principles investigation of transient current in molecular devices by using complex absorbing potentials, Phys. Rev. B 87, pp. 205401-1-205401-7 (2013).
Z. Y. Ning, Y. Zhu, J. Wang, and H. Guo, Quantitative Analysis of Nonequilibrium Spin Injection into Molecular Tunnel Junctions, Phys. Rev. Lett. 100, pp. 056803-1-056803-4 (2008).
J. D. Burton and E. Y. Tsymbal, Giant Tunneling Electroresistance Effect Driven by an Electrically Controlled Spin Valve at a Complex Oxide Interface, Phys. Rev. Lett. 106, pp. 157203-1-157203-4 (2011).
D. Waldron, V. Timoshevskii, Y. B. Hu, K. Xia, and H. Guo, First Principles Modeling of Tunnel Magnetoresistance of Fe/MgO/Fe Trilayers, Phys. Rev. Lett. 97, pp. 226802-1-226802-4 (2006).
V. Rokhlin, Rapid Solution of Integral Equations of Classical Potential Theory, J. Comput. Phys. 60, pp. 187-207 (1985).
J. Song, C. C. Lu, and W. C. Chew, Multilevel Fast Multipole Algorithm for Electromagnetic Scattering by Large Complex Objects IEEE trans. Antennas Propagat., 45, pp. 1488-1493 (1997).
J. Driscoll and K. Varga, Calculation of self-energy matrices using complex absorbing potentials in electron transport calculations, Phys. Rev. B 78, 245118-1-245118-6 (2008).
J. Hu, R.-X. Xu, and Y. Yan, Communication: Padé spectrum decomposition of Fermi function and Bose function, J. Chem. Phys. 133, pp. 101106-1-101106-4 (2010).
A. H. Castro Neto, N. M. R. Peres, K. S. Novoselov, and A. K. Geim, The electronic properties of graphene, Rev. Mod. Phys. 81, pp. 109-162 (2009).
Y. Zhang, Y.-W. Tan, H. L. Stormer and P. Kim, Experimental observation of the quantum Hall effect and Berry's phase in graphene, Nature 438, pp. 201-204 (2005).
E. Perfetto, G. Stefanucci and M. Cini, Time-dependent transport in graphene nanoribbons, Phys. Rev. B 82, pp. 035446-1-035446-5 (2010).
Y. O. Klymenko and O. Shevtsov, Quantum transport in armchair graphene ribbons: analytical tight-binding solutions for propagation through step-like and barrier-like potentials, Eur. Phys. J. B 69, pp. 383-388 (2009).
N. Yarvin and V. Rokhlin, An Improved Fast Multipole Algorithm for Potential Fields on the Line, Siam J. Numer. Anal. 36, pp. 629-666 (1999).
N. Säkkinen, Y. Peng, H. Appel, and R. van Leeuwen, Many-body Green's function theory for electron-phonon interactions: The Kadanoff-Baym approach to spectral properties of the Holstein dimer J. Chem. Phys. 143, pp. 234102-1-234102-19 (2015).

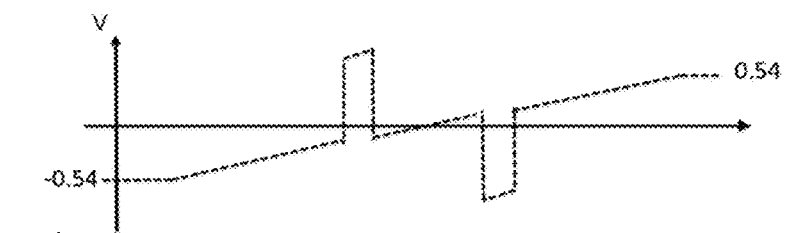
FIG. 1A
FIG. 1B
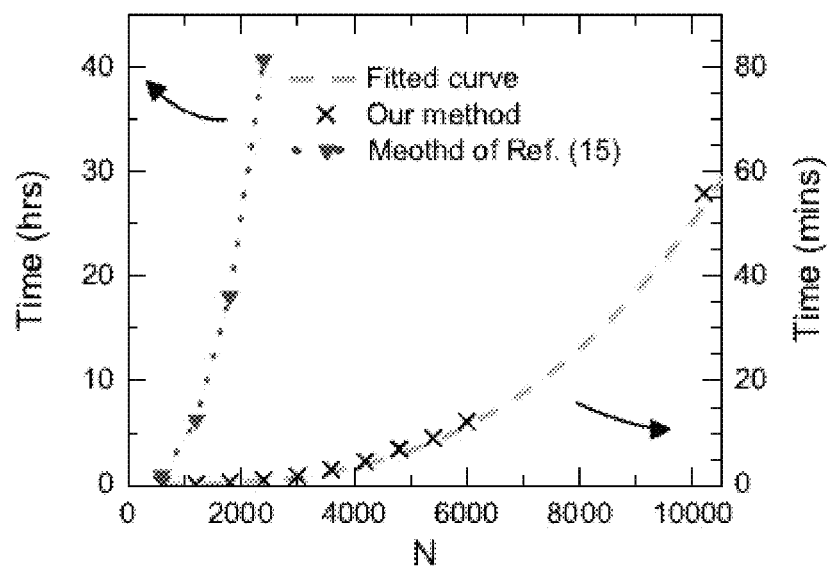
FIG. 2

US 10,330,712 B2

ORDER O(1) ALGORITHM FOR FIRST-PRINCIPLES CALCULATION OF TRANSIENT CURRENT THROUGH OPEN QUANTUM SYSTEMS

CROSS-REFERENCE TO RELATED PATENT APPLICATIONS

This application claims the benefit of U.S. Provisional Application No. 62/290,717 filed Feb. 3, 2016, which is incorporated herein by reference in its entirety.

FIELD OF THE INVENTION

This invention relates to a transient current calculation as part of the study of the response time and peak transient current in the design of nano-chips in nano electronics.

BACKGROUND OF THE INVENTION

At the heart of growing demands for nanotechnology is the need of ultrafast transistors whose response time is one of the key performance indicators. The response of a general quantum open system can be probed by sending a step-like pulse across the system and monitoring its transient current over time, thus making transient dynamics a very important consideration. Many experimental data show that most molecular device characteristics are closely related to the material and chemical details of the device structure. Therefore, first principles analysis, which involves quantitative and predictive analysis of device characteristics, especially their dynamic properties, without relying on any phenomenological parameter, becomes a central interest in the design of nanoelectronics.

The theoretical study of transient current dates back twenty years to when the exact solution in the wideband limit ("WBL") was obtained by Wingreen et al. See, N. S. Wingreen et al., *Phys. Rev. B* 48, 8487(R) (1993), which is incorporated herein by reference in its entirety. Since then transient current has been studied extensively using various methods, including the scattering wave function, non-equilibrium Green's function ("NEGF") approach, and density matrix method. See, J. Wang, *J. Comput. Electron.* 12, 343-355 (2013); S. Kurth et al., *Phys. Rev. B* 72, 035308 (2005)(hereinafter "Kurth"); G. Stefanucci et al, *Phys. Rev. B* 77, 075339 (2008)(hereinafter "Stefanucci"); Y. Zhu et al., *Phys. Rev. B* 71, 075317 (2005); J. Maciejko et al., *Phys. Rev. B* 74, 085324 (2006)(hereinafter "Maciejko"); R. Tuovinen et al., *Phys. Rev. B* 89, 085131 (2014)(herein after "Tuovinen"); R. Seoane Souto et al., *Phys. Rev. B* 92, 125435 (2015) and X. Zheng et al., *Phys. Rev. B* 75, 195127 (2007), all of which are incorporated herein by reference. The major obstacle to the theoretical investigation of transient current is its computational complexity. Many attempts have been made trying to speed up the calculation See Kurth and Tuovinen, as well as L. Zhang et al., *Phys. Rev. B* 86, 155438 (2012); B. Gaury et al., *Phys. Rep.* 534, 1-37 (2014); M. Ridley et al., *J. Phys.: Conf. Ser.* 696, 012017 (2016) (hereinafter "Ridley"); H A. Croy et al., *Phys. Rev. B* 80, 245311 (2009) and F J. Weston et al., *Phys. Rev. B* 93, 134506 (2016), all of which are incorporated herein by reference in their entirety.

Despite these efforts, the best algorithm for calculating the transient current from first principles going beyond WBL limit scales like $TN^3$ using a complex absorbing potential ("CAP"), where T and N are the number of time steps and the size of the system, respectively. See, L. Zhang et al, *Phys. Rev. B* 87, 205401 (2013) (hereinafter "Zhang"), which is incorporated herein by reference in its entirety. It should be noted that if WBL is used, the scaling is reduced. See, the Ridley article. However, to capture the feature of the band structure of the lead and the interaction between the lead and the scattering region, WBL is not a good approximation in the first principles calculation. As a result, most of the first principles investigations of transient dynamics were limited to small and simple one-dimensional systems.

There are a number of problems, such as with magnetic tunneling junctions (MTJ) and ferroelectric tunneling junctions, where the system is two dimensional or even three dimensional in nature. See, Z. Y. Ning et al., *Phys. Rev. Lett.* 100, 056803 (2008) and J. D. Burton et al., *Phys. Rev. Lett.* 106, 157203 (2011), which are incorporated herein by reference in their entirety. For these systems, a large number of k points $N_k$ have to be sampled in the first Brillouin to capture accurately the band structure of the system. For MTJ structures like Fe—MgO—Fe, at least $N_k=10^4$ k points must be used to give a converged transmission coefficient. See, D. Waldron et al., *Phys. Rev. Lett.* 97, 226802 (2006), which is incorporated herein by reference in its entirety. This makes the time consuming transient calculation $N_k$ times longer, which is an almost impossible task even with high performance supercomputers. Clearly it is urgent to develop better algorithms to reduce the computational complexity.

SUMMARY OF THE INVENTION

According to the present invention a novel algorithm based on NEGF-CAP formalism is used to calculate transient current as a function of time step T. The computational time of this algorithm is independent of T as long as $T < N^2$ where N is the system size. Hence the algorithm is order O(1) as long as $T < N^2$. Four important factors are essential to achieve this result: (1) the availability of an exact solution of transient current based on a non-equilibrium Green's function (NEGF) that goes beyond the wideband limit (WBL); (2) the use of complex absorbing potential (CAP) so that the transient current can be expressed in terms of poles of Green's function; (3) within the NEGF-CAP formalism the transient current can be calculated separately in the space and time domains making the O(1) algorithm possible so that at this point the computational complexity reduces to $50N^3 + TN^2$ (algorithm I); and (4) the exploitation of a Vandermonde matrix enables the use of the fast multipole method (FMM) and fast Fourier transform (FFT) to further reduce the scaling to $50N^3 + 2N^2 \log_2 N$ for $T < N^2$ and large N, which is therefore completely independent of T (algorithm II). See V. Rokhlin, *J. Comput. Phys.*, 60, 187-207 (1985)(hereinafter "Rokhlin") and J. Song et al., *IEEE trans. Antennas Propagat.* 45, 1488-1493 (1997)(hereinafter "Song"), which are both incorporated herein by reference in their entirety. It is possible with this new algorithm to calculate, and thus predict, the actual response of a nanodevice theoretically without experimental data. Thus, the algorithm is useful in the design of a nano-device before actual production.

Everything is made of atoms. In theory, every physical phenomena in a real device can be accurately calculated and predicted once its composition is known, e.g., how many atoms, which types of atoms, etc. From the Hamiltonian (a quantity that stores the physical information of the system based on the particular electrons of particular elements present in the devices), it is possible to use the algorithm of the present invention to calculate and predict the actual response of a nano-device. To verify the computational complexity, benchmark calculations were carried out on graphene nanoribbons using the tight-binding model. A speed up factor of 1000T was gained for a system size of N=2400. A calculation was also done for the same system with N=10,200 and T=10$^8$ confirming the O(1) scaling. This fast algorithm makes the computational complexity of transient current calculation comparable to that of a static calculation. Thus, the huge speed gain enables the performance of first principles transient calculations and nano-device design on a modest computer workstation.

For a general open quantum system with multiple leads under a step-like bias pulse, the Hamiltonian (the operator corresponding to the total energy of the system in most of the cases) is given by $$H(t) = \sum_{k\alpha} \epsilon_{k\alpha} \hat{c}_{k\alpha}^\dagger \hat{c}_{k\alpha} + \sum_n (\epsilon_n + U_n(t)) \hat{d}_n^\dagger \hat{d}_n + \sum_{k\alpha n} h_{k\alpha n} \hat{c}_{k\alpha}^\dagger \hat{d}_n + c.c.,$$

where $c^\dagger$ (c) denotes the electron creation (annihilation) operator in the lead region. The first term in this equation corresponds to the Hamiltonian of leads with $\epsilon_{k_\alpha}$ the energy of lead α which contains external bias voltage $v_\alpha(t) = V_\alpha \theta$ (±t). The second and third terms represent the Hamiltonian in the central scattering region and its coupling to leads, respectively. Also included is the time-dependent Coulomb interaction $U_n(t)$ in the scattering region. This Hamiltonian can be obtained using the first-principle method or it can be assumed to be a tight-binding form. Taking q=ℏ=1, the time-dependent terminal current $I_\alpha(t)$ of lead α is defined as in the Zhang article.

$$I_\alpha(t) = ReTr[\Gamma_\alpha(2H(t) - i\partial_t)G^<(t,t)\Gamma_\alpha], \quad (1)$$

where $\Gamma_\alpha$ is an auxiliary projection matrix which is used for measuring the transient current passing through the lead α. Here G$^<$ and H(t) are the lesser Green's function and the Hamiltonian of the central scattering region, respectively. For a step-like pulse an exact solution for G$^<$ has been obtained by Maciejko et al. as described in the Maciejko article, which goes beyond the WBL and has been applied to first principles calculation of transient current for atomic junctions. Next, the case of an upward pulse $v_\alpha(t) = V_\alpha \Theta(t)$ can be considered. In order to have an exact solution as described in the Maciejko article, it is assumed that $U_n(t) = U_{n,eq} + (U_{n,neq} - U_{n,eq})\Theta(t)$ where $U_{n,eq}$ is the equilibrium Coulomb potential, while $U_{n,neq}$ is the non-equilibrium potential at a long time limit. Note that the fast algorithm relies on this approximation where the self-consistent Coulomb potentials are needed only at two points: t=0$^-$ and t=∞. As a result of this approximation, at t=0, the system is in equilibrium with Hamiltonian $H_{eq}$ while at t>0 the system is in a non-equilibrium state with a time-independent Hamiltonian $H_{neq}$. In terms of a spectral function $A_\alpha(\epsilon,t)$, the lesser Green's function G$^<$ is given by the Maciejko article as $$G^<(t,t) = i \sum_\alpha \int \cdot d\epsilon 2\pi f(\epsilon) A_\alpha(\epsilon,t) \Gamma_\alpha(\epsilon) A_\alpha^\dagger(\epsilon,t). \quad (2)$$

The upward step-like bias pulse the $A_\alpha(\epsilon,t)$ is found in the Maciejko article to be $$A_\alpha(\epsilon,t) = \bar{G}^r(\epsilon + \Delta_\alpha) - \int \frac{d\omega}{2\pi i} \frac{e^{-i(\omega - \epsilon)t} \bar{G}^r(\omega + \Delta_\alpha)}{(\omega - \epsilon + \Delta_\alpha - i0^+)} \times \left[ \frac{\Delta_\alpha}{(\omega - \epsilon - i0^+)} + \Delta \tilde{G}^r(\epsilon) \right]$$

$$\equiv A_{1\alpha}(\epsilon + \Delta_\alpha) + \int d\omega e^{-i(\omega - \epsilon)t} A_{2\alpha}(\omega, \epsilon), \quad (3)$$

where $\bar{G}^r$ and $\tilde{G}^r$ are the non-equilibrium and equilibrium retarded Green functions, respectively, $\Delta_\alpha$ is the amplitude of the external bias $-V_\alpha$, and $\Delta = U_{neq} - U_{eq}$ is a matrix where the subscript "neq" and "eq" refer to non-equilibrium and equilibrium potentials, respectively.

Despite the simplification from the conventional double time G$^<$(t,t') to single time G$^<$(t,t) used in Eq. (1), the computational cost to obtain G$^<$ remains very demanding for the following reasons:

(1) Consider $A_\alpha(\epsilon,t)$ with a matrix size of N, matrix multiplications $\bar{G}^r(\omega + \Delta_\alpha)$ and $\tilde{G}(\epsilon)^r$ in the integrand of Eq. (3) require computational complexity of O(N$^3$) for each time step. As a result, the total computational cost over a period of time is at least O(TN$^3$) where T is the number of time steps.

(2) Double integrations in energy space are required for G$^<$. The presence of numerous quasi-resonant states whose energies are close to the real energy axis makes the energy integration in $A_\alpha$ extremely difficult to converge.

This problem can be overcome using the CAP method as described in the article J. Driscoll and K. Varga, *Phys. Rev. B* 78, 245118 (2008), which is incorporated herein by reference in its entirety. The essence of the CAP method is to replace each semi-infinite lead by a finite region of CAP while keeping the transmission coefficient of the system unchanged. In addition, it is demonstrated in the Zhang article that the first principles result of transient current for molecular junctions obtained from the exact numerical method (non-WBL) and the CAP method are exactly the same. Using the CAP method, the poles of Green's function can be obtained easily and the spectral function can be calculated analytically using the residue theorem. Expanding the Fermi function using the Pade spectrum decomposition (PSD), as explained more fully in the detailed description of the invention below, further allows for the calculation of the transient current separately in space and time domain making the O(T$^0$N$^3$) algorithm possible. See, J. Hu et al., *J. Chem. Phys.* 133, 101106 (2010), which is incorporated herein by reference in its entirety.

Achieving the algorithm of the present invention for the transient current calculation can now be demonstrated, i.e., $I_\alpha(t_j)$ for j=1, 2, . . . , T. First Eq. (3) is substituted into Eq. (2), and G$^<$(t,t) can be written as $$G^<(t,t) = (i/\pi)\left[B_1 + \int d\omega d\omega' e^{-i(\omega - \omega')t} B_2(\omega, \omega') + \sum_\alpha \int d\epsilon d\omega' e^{i(\omega' - \epsilon)t} f(\epsilon) A_{1\alpha} W_\alpha A_{2\alpha}^\dagger + c.c.\right], \quad (4)$$

where,
$B_1 = \int d\epsilon f(\epsilon) \Sigma_\alpha A_{1\alpha} W_\alpha A_{1\alpha}^\dagger$, $B_2(\omega, \omega') = \int d\epsilon f(\epsilon) \Sigma_\alpha A_{2\alpha}(\omega, \epsilon) W_\alpha A_{2\alpha}^\dagger(\omega', \epsilon)$, and $W_\alpha$ is the CAP matrix. In terms of the poles of Green's function and the Fermi distribution function, which are explained more fully in the detailed description of the invention below, we have:

$$G^<(t,t) = (i/\pi)\left[B_1 + \sum_{nm} e^{-i(\epsilon_n - \epsilon_m^*)t} \bar{B}_2(\epsilon_n, \epsilon_m^*) + + \sum_\alpha \sum_{lm} e^{-i(\bar{\epsilon}_l - \epsilon_m^* + \Delta_\alpha)t} \bar{f}(\bar{\epsilon}_l) \bar{B}_{3\alpha}(\bar{\epsilon}_l, \epsilon_m^*) + \right. \quad (5)$$

-continued $$c.c. + \sum_\alpha \sum_{nm} e^{-i(\epsilon_n - \epsilon_m^*)t} f(\epsilon_n - \Delta_\alpha) \bar{B}_{4\alpha}(\epsilon_n, \epsilon_m^*) + c.c.\Bigg],$$

where $\epsilon_n$ and $\epsilon_m$ (n=1, 2, ... N) is the complex energy of $$H_{neq} - i \sum_\alpha W_\alpha$$

in the lower half plane, while $\tilde{\epsilon}_l$ are the poles of $f(E)$ using PSD with l=1, ... $N_f$; and $N_f$ is the total number of those poles for the adopted Pade approximant.

Within the CAP framework, $G^<$ in Eq. (1) is the lesser Green's function of the central scattering region excluding the CAP regions. Substituting the second term of Eq. (4) into the first term in Eq. (1), its contribution to current (denoted as $I_1$) is $$I_1(t) = \mathrm{Re} \sum_{nm} e^{-i(\epsilon_n - \epsilon_m^*)t} Tr[\Gamma_\alpha 2 H_{neq} \bar{B}_2(\epsilon_n, \epsilon_m^*) \Gamma_\alpha] \quad (6)$$

$$\equiv 2\mathrm{Re} \sum_{nm} e^{-i(\epsilon_n - \epsilon_m^*)t} M_{nm},$$

where the matrix M does not depend on time. Thus, the space and time domains have been separated.

Denoting a Vandermonde matrix $V_{jk} = \exp(i\epsilon_k t_j)$ with k=1, 2, ..., N, $t_j = j dt$, j=1, 2, ..., T where dt is the time interval and $I_1(t_j) = [V^t(M+M^\dagger)V^*]_{jj}$. Using this approach, $I_L$ is finally obtained. This calculation is more fully explained in the detailed description below:

$$I_L(t_j) = I_{0L} + [V^t M_1 V^*]_{jj} + \left(\sum_{\alpha=L,R} [V^t M_{2\alpha} \bar{V}_\alpha^*]_{jj} + c.c.\right), \quad (7)$$

where $\tilde{V}_{\alpha jk} = \exp(i(\tilde{\epsilon}_k + \Delta_\alpha)t_j)$ is a $T \times N_f$ matrix, $M_1$ is a $N \times N$ matrix while $M_2$ is a $N \times N_f$ matrix. Since $\epsilon_k$ is the complex energy in the lower half plane, $V_{jk}$ goes to zero at large j. Hence $I_{0L}$ is the long time limit of the transient current which can be calculated using the Landauer Buttiker formula. The time dependent part of the transient current can be separated into a real space calculation (calculation of $M_1$ and $M_{2\alpha}$) and then a matrix multiplication involving time. At room temperatures the Fermi function can be accurately approximated by 15 or 20 Pade approximants. Hence the calculation of $[V^t M_1 V^*]_{jj} + (\Sigma_\alpha [V^t M_{2\alpha} V_\alpha^*]_{jj} + c.c.)$ can be combined to give $TN^2$ computational complexity.

The computational complexity of this algorithm (denoted as algorithm I) can now be examined. By counting the number of matrix multiplication, the computational complexity of the real space calculations can be estimated to be $50N^3$. Therefore the total computational complexity is $50N^3 + TN^2$. At this stage, the algorithm is not O(1) yet. In the detailed description below it is shown that matrix multiplication $V^t M$, where M is $M_1$ or $M_{2\alpha}$, can be done using the FMM and FFT (denoted as algorithm II). This reduces the computational complexity of $V^t M$ from $TN^2$ to $T \log_2 N$. Hence for $T < N^2$, the computational complexity is $50N^3 + T \log_2 N$. For $T > N^2$, the scaling is $50N^3 + T \log_2 N$. However, for large T, the physics comes into play. Since $\epsilon_j$ is the complex energy of the resonant state, $V_{jT} = \exp(-i\epsilon_j dtT)$ decays quickly to zero before $T = N^2$. For a graphene nanoribbon with $N=10^4$ (see details below), the maximum value of $V_{jT} = \exp(-i\epsilon_j dtT)$ is $10^{-3}$ when T=N and dt=1 fs. Consequently all of the matrix elements are zero for T=10N. Hence for large systems, the chance to go beyond $T=N^2$ is small. In this sense, algorithm II is an order O(1) algorithm.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and other objects and advantages of the present invention will become more apparent when considered in connection with the following detailed description and appended drawings in which like designations denote like elements in the various views, and wherein:

FIG. 1A shows the configuration of a gated graphene nanoribbon and a voltage applied to it over time and FIG. 1B shows the transient current of the zigzag graphene nanoribbon for a system of 600 atoms for the present invention and the Zhang method;

FIG. 2 shows the scaling of computation time versus the number of computations N for the prior art Zhang method and the Algorithm I of the method according to the present invention;

DETAILED DESCRIPTION OF EXEMPLARY EMBODIMENTS

First principles transient current calculation is essential to the study of the response time and to capture the peak transient current for preventing the melt down of nano-chips in nano-electronics. For a period of time T, its calculation is known to be extremely time consuming with the best scaling being $TN^3$ where N is the dimension of the device. The dynamical response of the system is usually probed by sending a step-like pulse and monitoring its transient behavior.

Figure 9:
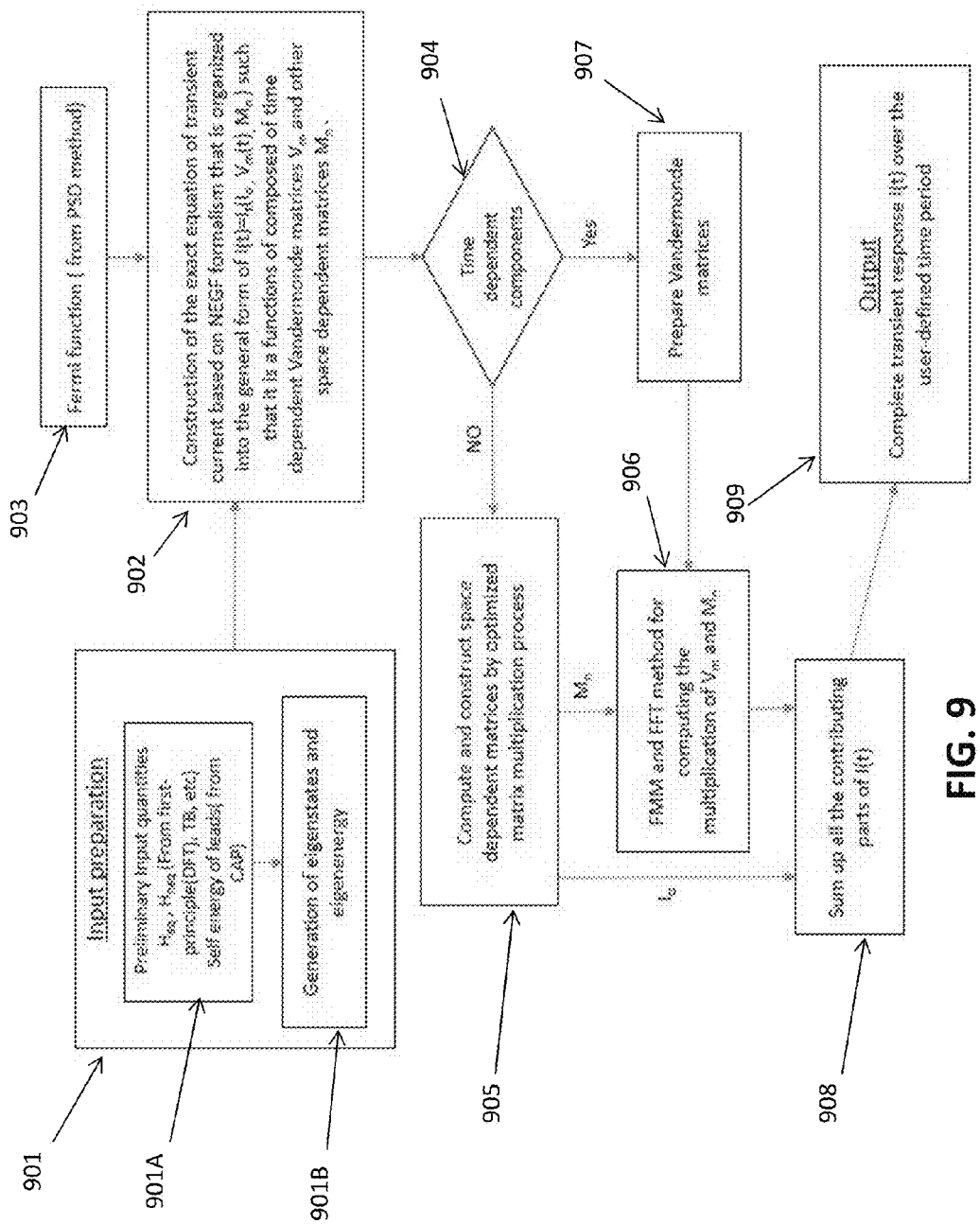
FIG. 9 is a flow chart showing the process for the calculation of the algorithm according to the present invention.

The present invention is directed to a new algorithm for calculating the transient current of a system, which requires much less computational time than the prior art. FIG. 9 shows a flow chart of the method for calculating the algorithm of the present invention. It can be carried out on a computer workstation as part of the design of a nano-device.

Generally speaking, the algorithm provides an O(1) computational method for obtaining the transient response of current I(t) over the entire user-defined time period under suitable conditions. The input parameters for this algorithm include Hamiltonians of the open quantum system before and after the transient process denoted as $H_{eq}$ and $H_{neq}$. These Hamiltonians, whether based on atomistic first-principle density functional theory (DFT) or tight-binding methods, can be adopted at will for the system of interest. Nonetheless, complex absorbing potential (CAP) is required to represent the self-energy of the leads of the device. Subsequently, corresponding eigenstate and energy can be generated and fed into the algorithm. Additionally, Fermi function is expanded using Pade spectrum decomposition (PSD).

It is only possible to construct the particular exact equation of transient current which can be calculated separated in space and time domains by using the mentioned form of input ingredients. Once such an equation is constructed, whether for the case for step-up, step-down bias or other similar classes of transient response, so that I(t) is a function of $I_o$, $V_m(t)$ and $M_n$ for some m and n where $V_m(t)$ are Vandemonde matrices and $I_o$ and $M_n$ are time independent matrices. Once the required Vandemonde matrices and $M_n$ are constructed, fast multi pole method (FMM) and fast Fourier transform (FFT) are used to calculate the matrix multiplication between them. Eventually, I(t) can be obtained by summing up the contribution due to $I_o$, $V_m(t)$ and $M_n$.

In step 901 of FIG. 9 the process begins with input preparation. This includes step 901A, which involves forming Preliminary Input quantities $H_{eq}$, $H_{neq}$ (From first-principle (DFT), TB, etc) and Self energy of leads (from CAP). In step 901B eigenstates and eigen-energy are generated. This input information is then directed to step 902. In step 902 construction is performed on the exact equation of transient current based on NEGF formalism that is organized into the general form of $I(t)=l_t(I_o, V_m(t), M_n)$ such that it is a function composed of time dependent Vandermonde matrices $V_m$ and other space dependent matrices $M_n$. Also, there is an input from step 903, i.e., Fermi functions (from the PSD method) to step 902.

The results of step 902 are then reviewed in step 904 to see if they contain time dependent components. If the answer is NO, the process moves to step 905. In step 905 the process computes and constructs space dependent matrices by an optimized matrix multiplication process. From step 905 the process goes to step 906 where the FMM and FFT methods are used for computing the multiplication of $V_m$ and $M_n$.

If the result of step 904 is YES, the process moves to step 907 where Vandermonde matrices are prepared before moving to step 906. The results in both step 905 and 906 are summed in Step 908. The summed results are directed to output step 909, where the complete transient response I(t) over the user-defined time period is generated.

To demonstrate the power of the algorithm according to the present invention, the transient current in a graphene nanoribbon is calculated. Graphene is a well-known intrinsic 2D material with many exotic properties. See, A. H. Castro Neto et al., *Rev. Mod. Phys.* 81, 109 (2009) and Y. Zhang et al., *Nature*, 438, 201-204 (2005), which are incorporated herein by reference in their entirety. Studies of its transient behavior in response to a step-like pulse have been reported in the literature. See the Stefanucci article and E. Perfetto et al., *Phys. Rev. B* 82, 035446 (2010) and Y. O. Klymenko et al., *Eur. Phys. J. B* 69, 383-388 (2009), which are both incorporated herein by reference in their entirety.

The algorithm of the present invention was tested on a gated graphene nanoribbon at room temperature using the tight-binding (TB) Hamiltonian given by $$\hat{H} = -h_0 \sum_{<i,j>} \hat{c}_i^\dagger \hat{c}_j - q \sum_i [V_1\theta(t) + V_{g1i} + V_{g2i}]\hat{c}_i^\dagger \hat{c}_i, \quad (8)$$

where $\hat{c}_i^\dagger(\hat{c}_i)$ is the creation (annihilation) operator at site i and $h_0=2.7$ eV being the nearest hopping constant. Here $V(x)=V_L+(V_R-V_L)x/L$ is the potential landscape due to the external bias with $V_R=-V_L=0.54$V, and $V_{g1}$ and $V_{g2}$ being the gate voltages in regions $S_1$ and $S_2$, respectively.

Figure 5:
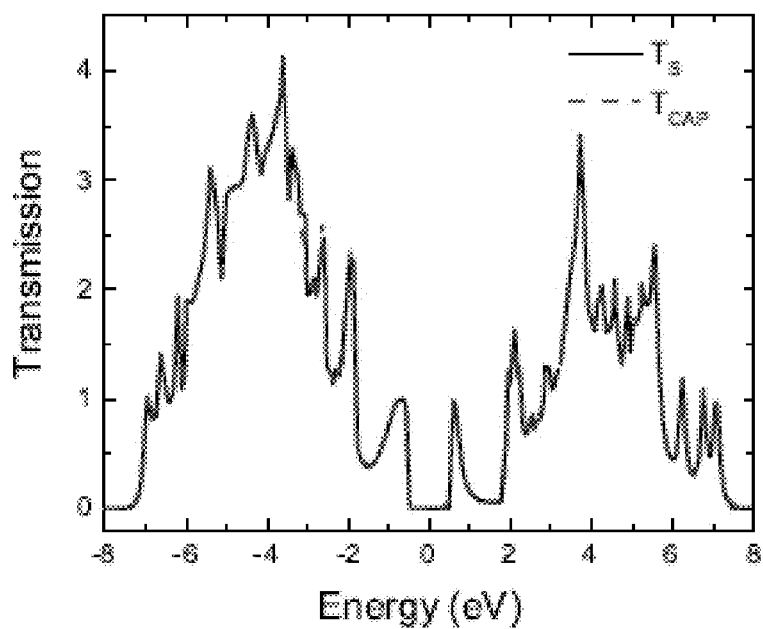
FIG. 5 is a graph of the transmission coefficient of a zigzag graphene nanoribbon for a system of 10,000 atoms calculated by 30 layers of CAP and by exact numerical solution.

First it is confirmed that the transient current calculated using the new method is the same as that of the Zhang reference. Using 30 layers of CAP, the transmission coefficient versus the energy was calculated and it showed good agreement with the exact solution. FIG. 5 provides a comparison for a graphene nanoribbon with N=10,000. In FIG. 5 the solid line ($T_S$) is the exact numerical result using self-energy of the lead and the dashed line ($T_{CAP}$) is from CAP. This also ensures the correct steady state current. For the transient current, excellent agreement is also obtained between the algorithm of the present invention and that of the Zhang reference (See FIG. 2). It should be noted that in the presence of gates, the "on-off" time of graphene is shortened in comparison to un-gated graphene which has a long oscillating current as reported in the Stefannucci article. Also the transient current is calculated for a graphene nanoribbon with size of $N=10^4$ and T=20,000 with each time step 1 fs. See FIG. 5.

Figure 3:
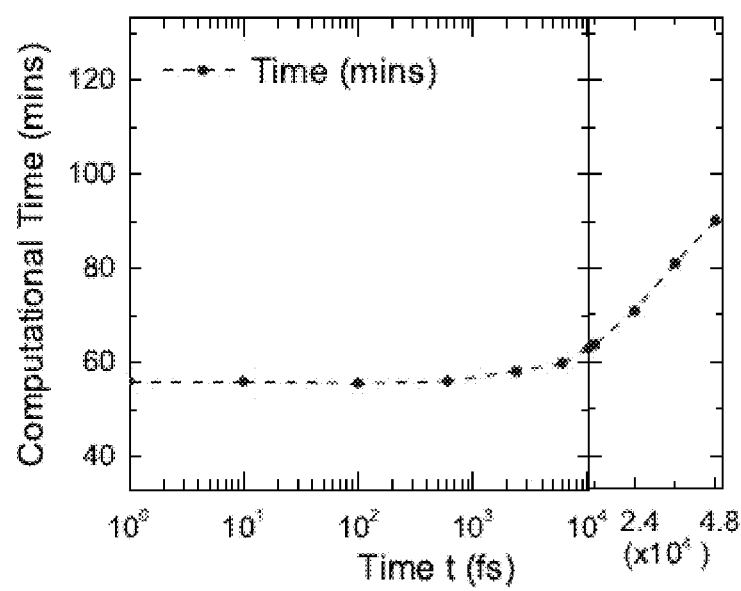
FIG. 3 shows the scaling of computational time against time t for N equal to 10,200, time step dt=1 fs.

Now testing of the scaling of the algorithm of the present invention can be achieved by calculating the transient current for nanoribbons with different system sizes ranging from 600 to 10,200 atoms. The first test is with algorithm I. The computational time for the transient current for 3 time steps compared against system sizes N is shown in FIG. 2. In FIG. 5 the data is fitted using $50N^3+TN^2$ with very good agreement showing $TN^2$ scaling for the time-dependent part. For comparison, FIG. 5 also shows a plot of the computation time using the method in the Zhang reference. It was found that the number of energy points $N_E$ depends on the spectrum of resonant states of the system. For graphene nanoribbons with 600 atoms, $N_E=6000$ was used to converge the integral over a Fermi function. FIG. 2 shows that a speed up factor of 1000T is achieved at N=2400. The scaling is shown in FIG. 3, from which it can be seen that for T<N the computational time is almost independent of the number of time steps.

Now algorithm II, which reduces the scaling $TN^2$ further, can be examined. Notice that the scaling $TN^2$ comes from matrix multiplication involving Vandermonde matrix $V^tM_1$. The fast algorithm is available to speed up the calculation involving a structured matrix, such as the Vandermonde matrix. As discussed in detail below the FMM as in the Rokhlin and Song articles and FFT can be used to carry out the same matrix multiplication using only $c_3N^2 \log_2 N$ operations provided that $T<N^2$. Here the coefficient $c_3$ is a large constant that depends only on the tolerance of the calculation τ and the setup of FMM. The theoretical estimate of this coefficient is about $40 \log_2(1/\tau)$ where τ is the tolerance in the FMM calculation, which used $\tau=10^{-4}$. See N. Yarvin et al., *Anal.* 36, 629 (1999), which is incorporated herein by reference in its entirety. When implementing FMM, this coefficient is in general larger than the theoretical one.

To test algorithm II, the transient current is calculated for $N=10^4$ and $T=10^8$ as explained in detail below, using FMM and FFT. Denote $t_1$ the CPU time needed for the spatial calculation ($50N^3$), $t_2$ is the time needed for the temporal part (matrix multiplication in Eq. (7)) using, e.g., a Xeon X5650 workstation with 12 cores and a frequency of 2.67 GHz. The result $t_1$=3500s is obtained using 12 cores and $t_1$=33800s using a single core so the efficiency of multi-threading is about 80%. For an FMM calculation, multi-threading could be very inefficient so a single core has been used to perform the calculation. It was found $t_2$=3400s for T=$10^8$ using a single core, as shown below in the detailed computational analysis and numerical calculation. It was found that for T=$10^8$ the time spent in the time dependent part is about one tenth of the time of the independent calculation. This confirms that the method of the present invention uses an algorithm of order O(1) as long as T<$N^2$. It should be pointed out that algorithm II is directed to the calculation of the transient current I(t) with time steps T=$N^2$ at one shot with scaling $N^2 \log_2 N$. This scaling remains if I(t) with the number of time step less than $N^2$ is desired.

FIG. 2 shows the scaling of N against computation time at T=3 (each time step is 1 fs). The fitted curve, which is in the form of $50N^3+TN^2$, is in good agreement with the calculated results The Y-axis is on the right. In order compare the present invention to the performance reported in the Zhang reference, 6000 energy points were used for integration using the Y-axis on the left.

FIG. 3 illustrates the scaling of t against CPU time for N=10,200 (t=100 fs corresponds to T=100) using algorithm I. The left hand side uses an exponential scale in t and the right hand side uses a linear scale in t. FIG. 3 shows that at extremely large data points, e.g., ranges over 10 thousands points, the computational time is proportional to T.

Since the algorithm of the present invention is based on the NEGF-CAP formalism, it can be extended to the NEGF-DFT-CAP formalism which performs the first principles calculation. In fact, the NEGF-DFT-CAP method has already been successfully implemented in the first principles transient current calculation as shown in the Zhang reference, which gives exactly the same result as that of NEGF-DFT. With the fast algorithm at hand, many applications can be envisaged. For instance, the transient spin current (related to spin transfer torque) using the NEGF-DFT-CAP formalism has been carried out for planar structures where k-sampling in the first Brillouin zone is needed. It is straightforward to include k-sampling in the method of the present invention. It is also possible to extend this method to the case where electron-phonon interaction in the Born approximation as well as other dephasing mechanisms are present. Finally, first principles transient photo-induced current on two dimensional layered materials can be calculated using the method of the present invention.

Some of the details of the calculations presented above are given here.

Pade Approximant

Brute force integration over the Fermi function along the real energy axis to obtain $G^<(t,t)$ may need thousands of energy points to converge, which is very inefficient. To obtain an accurate result while reducing the cost, fast converging Pade spectrum decomposition (PSD) is used for the Fermi function $f$ in Eq. (4) above, so that the residue theorem can be applied. Using [n-1/n] PSD scheme with the Pade approximant accurate up to $O((\varepsilon/kT)^{4n-1})$, Fermi function $f$ can be expressed as $$f(\varepsilon) = \frac{1}{2} - \sum_{j=1}^{n} \frac{2\eta_j \beta \varepsilon}{(\beta \varepsilon)^2 + \xi_j^2}, \quad (9)$$

where $\xi_j$ and $\eta_j$ are two set of constants that can be calculated easily. Using the PSD scheme analytic form of $G^<$ in Eq. (4) can be obtained using the residue theorem. See J. Hu et al., *J. Chem. Phys.* 133, 101106 (2010), which is incorporated herein by reference in its entirety.

Calculation of the Spectral Function

The terms $\tilde{G}^r(\epsilon)$ and $\overline{G}^r(\epsilon)$, the equilibrium and non-equilibrium retarded Green's functions, respectively, can be expressed in terms of their eigen-functions by solving the following eigen-equations for $H_{eq}$ and $H_{neq}$, i.e., $$(H_{eq}-iW)\psi_n^0 = \epsilon_n^0 \psi_n^0,$$

$$(H_{eq}+iW^\dagger)\phi_n^0 = \epsilon_n^0 \phi_n^0, \quad (10)$$

where $$W = \sum_\alpha W_\alpha$$

and similar equations can be defined for $H_{neq}$. See the Zhang reference. Using the eigen-functions of $H_{eq}$–iW and $H_{neq}$–iW, we have $$\tilde{G}^r(\epsilon) = [\epsilon - H_{eq} + iW]^{-1} = \sum_n \frac{|\psi_n^0\rangle\langle\phi_n^0|}{(\epsilon - \epsilon_n^0 + i0^+)}, \quad (11)$$

$$\overline{G}^r(\epsilon) = [\epsilon - H_{neq} + iW]^{-1} = \sum_n \frac{|\psi_n\rangle\langle\phi_n|}{(\epsilon - \epsilon_n + i0^+)}. \quad (12)$$

Performing an integral over $\omega$ using the residue theorem, the analytic solution of $A_\alpha$ is obtained $$A_\alpha(\epsilon, t) = \sum_n \frac{|\psi_n\rangle\langle\phi_n|}{\epsilon + \Delta_\alpha - \epsilon_n + i0^+} + \sum_n \frac{e^{i(\epsilon+\Delta_\alpha-\epsilon_n)t}|\psi_n\rangle\langle\phi_n|}{\epsilon - \epsilon_n + i0^+} \times \quad (13)$$

$$\left[\frac{\Delta_\alpha}{\epsilon + \Delta_\alpha - \epsilon_n + i0^+} - \Delta \sum_l \frac{|\psi_l^0\rangle\langle\phi_l^0|}{(\epsilon - \epsilon_l^0 + i0^+)}\right],$$

where $\Delta = H_{neq} - H_{eq}$.

Calculation of the Lesser Green's Function

In Eq. (5) using residue theorem the involved terms are defined as $$\overline{B}_2 = -4\pi^2[B_2(\omega, \omega')(\omega - \epsilon_n)(\omega' - \epsilon_m^*)]|_{\omega=\epsilon_n, \omega'=\epsilon_m^*}$$

$$\overline{B}_{3\alpha} = -2\pi i A_{1\alpha}(\tilde{\epsilon}_l) W_\alpha [A_{2\alpha}^\dagger(\omega', \tilde{\epsilon}_l)(\omega' - \epsilon_m^*)]|_{\omega'=\epsilon_m^*}$$

$$\overline{B}_{4\alpha} =$$
$$-4\pi^2[A_{1\alpha}(\epsilon) W_\alpha A_{2\alpha}^\dagger(\omega', \epsilon)(\omega' - \epsilon_m^*) \times (\epsilon - \epsilon_n + \Delta_\alpha)]|_{\epsilon=\epsilon_n-\Delta_\alpha, \omega'=\epsilon_m^*}$$

$$\overline{f} = 2\pi i(f(\epsilon)(\epsilon - \tilde{\epsilon}_l))|_{\epsilon=\epsilon_l}$$

Calculation of the Transient Current

Starting from Eq. (1) and in analogue to Eq. (6), the expressions of the current in Eq. (7) can be obtained as follows:

$$I_{0L}(t_j) = 2\text{Re}Tr\left[\frac{i}{\pi}\Gamma_L H_{neq} B_1 \Gamma_L\right]$$

$$M_1 = \text{Re}Tr\left[\frac{i}{\pi}\Gamma_L(2H_{neq} - (\epsilon_n - \epsilon_m^*))\left(\overline{B}_2 + \sum_\alpha f(\epsilon_n - \Delta_\alpha)\overline{B}_{4\alpha}\right)\Gamma_L\right]$$

$$M_{2\alpha} = \text{Re}Tr\left[\frac{i}{\pi}\Gamma_L(2H_{neq} - (\tilde{\epsilon}_l - \epsilon_m^* + \Delta_o))(f(\epsilon_m^*)\overline{B}_{3\alpha})\Gamma_L\right].$$

The expression of transient current $I_R(t)$ is similar to Eq. (7).

Transient Current for a Graphene Nanoribbon of System Size $N=10^4$

Figure 4:
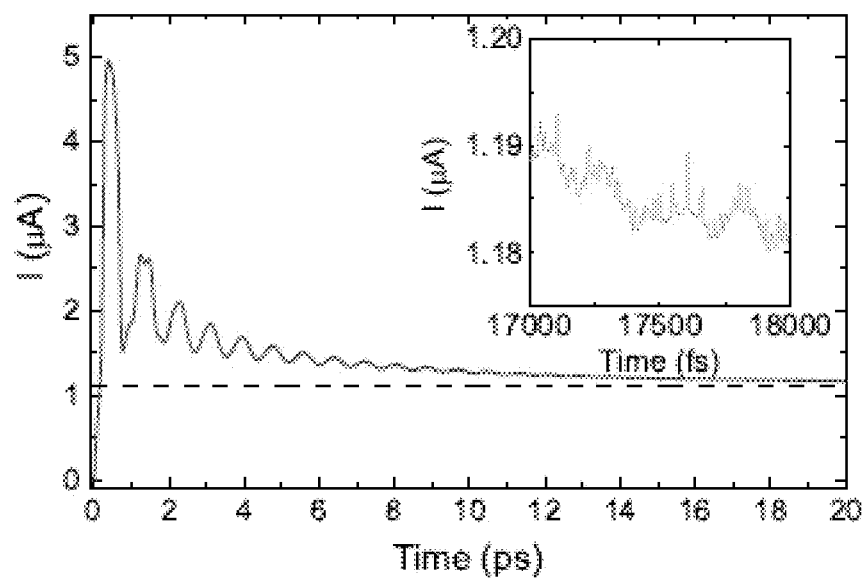
FIG. 4 shows a graph of the typical behavior of transient current, wherein the inset is the long time behavior between 17 ps to 18 ps.

A calculation was performed on transient current through a zigzag graphene nanoribbon of 10,000 atoms with T=20,000 time steps (each time step is 1 fs). The width of the system is two unit cells (16 atoms) while the length of the system is 625 unit cells. Two gate voltages of 2.2V were applied so that the system is in the tunneling regime. The bias voltage is $v_L=v_R=0.5V$. From FIG. 4, it can be seen that a typical behavior of transient current with the current shooting up initially and then decreasing oscillations to the long time limit (the numerical results using FMM show that 100 ps is needed to reach the dc limit, which is shown as a dashed line). The oscillatory behavior is due to resonant states in the system. This test was at a temperature of 300° K. The inset is the long time behavior between 17 ps to 18 ps.

FIG. 5 shows the transmission coefficient of the zigzag graphene nanoribbon for a system of 10,000 atoms. The solid line ($T_S$) is the exact numerical result using self-energy of the lead and the dashed line ($T_{CAP}$) is from CAP. Thus, FIG. 5 shows a comparison between the exact numerical result of the transmission coefficient using the self-energy of the lead and that of CAP. There is very close agreement.

Fast Multipole Method

The fast multipole method has been widely used and has been ranked top 10 best algorithms in 20th Century. See, V. Rokhlin, *J. Comput. Phys.* 60, 187-207 (1985); J. Song, C. C. Lu, and W. C. Chew, *IEEE trans. Antennas Propagat.* 45, 1488-1493 (1997); and B. A. Cipra, *SIAM News,* 33(4), 2 (2000), which are incorporated herein by reference in their entirety. It is extremely efficient for large N. The following quantity is then calculated:

$$I(t) = \sum_{n,m} \exp(-i\varepsilon_n t) M_{nm} \exp(i\varepsilon_m^* t), \quad (14)$$

where the matrix M can be expressed in terms of vectors as $M=(c_0, c_1, \ldots, c_{N-1})$ and $V_{nj}=\exp(-i\varepsilon_n t_j)$ is a Vandermonde matrix with $t_j=jdt$ and $j=1, 2, \ldots T$. Eq. (14) is of the form $V^t M V^*$ where t stands for transpose. In the following, an outline of how to calculate $V^t c$ where c is a vector of N components is given.

Setting $a_j=\exp(-i\varepsilon_j dt)$ and denoting T the number of time steps. Then $b=V^t c$ is equivalent to $$b_n = \sum_{j=0}^{N-1} c_j(a_j)^n.$$

A direct computation shows that the entries of $b=V^t c$ are the first T coefficients of the Taylor expansion of $$S(x) = \sum_{j=0}^{N-1} \frac{c_j}{1-a_j x} = \sum_{n}^{\infty} \sum_{j=0}^{N-1} c_j(a_j x)^n = \sum_n b_n x^n, \quad (15)$$

where $b_n = \sum_{j=0}^{N-1} c_j(a_j)^n$.

Denoting $\bar{S}(x)=\sum_{n=0}^{T-1} b_n x^n$ and setting $x=\omega_T^l$ with $\omega_T=\exp(i2\pi/T)$ it can be used to calculate $\bar{S}(\omega_T^l)$ which is the Fourier transform of $b_n$, $$S(\omega_T^l) = \sum_{j=0}^{N-1} \sum_{n=0}^{T-1} c_j a_j^n \omega_T^{nl}$$

$$= \sum_{j=0}^{N-1} c_j \frac{1-(a_j \omega_T^l)^T}{1-a_j \omega_T^l}$$

$$= \omega_T^{-l} \sum_{j=0}^{N-1} \frac{c_j(1-a_j^T)}{(1/\omega_T)^l - a_j},$$

where $\omega_T^T=1$ is used. Note that the fast multipole method (FMM) aims to calculate $$v_l = \sum_j c_j/(x_l - a_j)$$

with O(N) operations instead of $N^2$ operations. Hence $\bar{S}(\omega_T^l)$ can be obtained using FMM, from which $b_n$ can be calculated using FFT.

Now the computational complexity for T≤N can be estimated. For FMM the value $\kappa_1 \max(T,N)$ operations are needed where $\kappa_1$ is about $40 \log_2(1/\tau)$ with $\tau$ the tolerance. See N. Yarvin and V. Rokhlin, *SIAM J. Numer. Anal.* 36, 629 (1999), which is incorporated herein by reference in its entirety. For FFT the computational complexity is at most $\kappa_2 N \log_2 N$, where $\kappa_2$ is a coefficient for FFT calculation. To compute $V^t M$ where M has N vectors, $V^t c$ is calculated N times. Hence the total computational complexity is $\kappa_1 N^2 + \kappa_2 N^2 \log_2 N$. This algorithm is denoted as algorithm IIa while the algorithm for $T<N^2$ discussed below is denoted as algorithm IIb.

For very large T up to $T=N^2$ (if $N=10^4$ and $T=10^8$), it can be shown that the computational complexity is $\kappa_1 N^2 + 2\kappa_2 N^2 \log_2 N$. In fact, it is easy to see that $I(t_j)$ defined in Eq. (6) is the first T coefficients of the Taylor expansion of $$S(x) = \sum_{n,m=0}^{N-1} \frac{M_{nm}}{1-a_n a_m^* x} \quad (16)$$

$$= \sum_{j}^{\infty} \sum_{n,m=0}^{N-1} M_{nm}(a_n a_m^*)^j x^j \quad (17)$$

$$= \sum_j I(t_j);$$

where $a_n=\exp(-i\varepsilon_n dt)$. Now two new vectors u and d can be defined which have $N^2$ components with $u^t=(c_0^t, c_1^t, \ldots, c_{N-1}^t)$ (recall the definition $M=(c_0, c_1, \ldots, c_{N-1})$) and $d^t=(a_0^* a^t, a_1^* a^t, \ldots, a_{N-1}^* a^t)$, where once again t stands for transpose. With the new vectors defined, S(x) in Eq. (16) is expressed as $$S(x) = \sum_{j=0}^{N^2-1} \frac{u_j}{1-d_j x}, \quad (18)$$

which is exactly the same form as Eq. (15). The only difference is that c and a in Eq. (15) have N components and S has to be calculated N times while u and d in Eq. (18) have $N^2$ components and S can be calculated according to Eq. (18) just once. Therefore the computational complexity is $\kappa_1 N^2 + \kappa_2 N^2 \log_2 N^2$. If T=nN with n=1, 2, ... N, it is not difficult to show that the computational complexity is $\kappa_1 TN/n + \kappa_2 T(N/n)\log_2(nN) = \kappa_1 N^2 + \kappa_2 N^2 \log_2(nN)$.

To summarize, the computational complexity of Eq. (14) is $\kappa_1 N^2 + 2\kappa_2 N^2 \log_2 N$ for $T<N^2$. It is easy to show that for $T>N^2$ the scaling is $\kappa_1 N^2 + 2\kappa_2 T \log_2 N$. However, for large T, the physics comes into play. Since $a_j = \exp(-i\varepsilon_j dt)$ with $\varepsilon_j$ the energy of resonant state, $a_j^T$ quickly decays to zero before $T=N^2$ and hence no need to go up for $T>N^2$.

Figure 6:
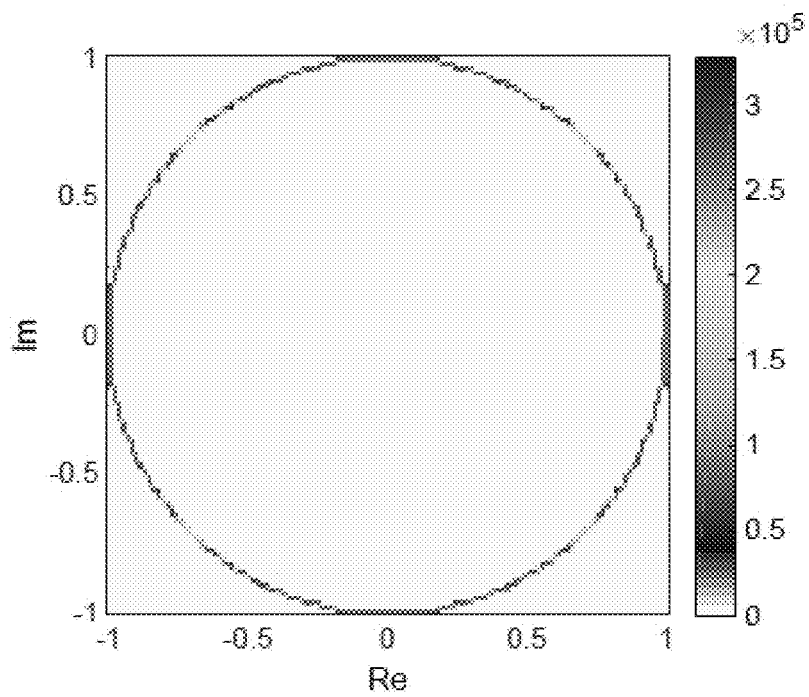
FIG. 6 shows the distribution of $(1/\omega_T)^j$ on the complex plane.
Figure 7:
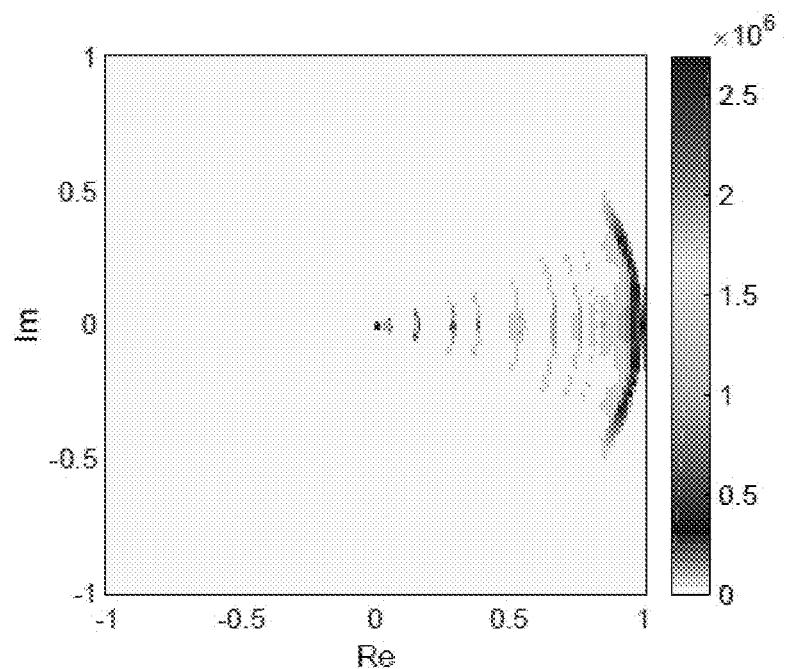
FIG. 7 shows the distribution of d on the complex plane.
Figure 8:
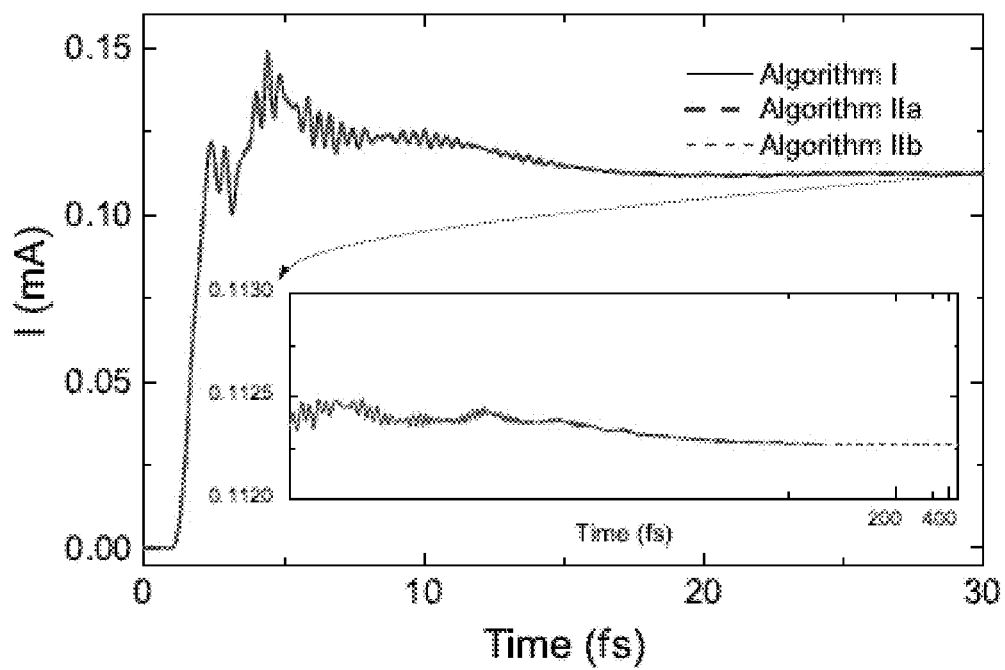
FIG. 8 illustrates the transient current calculated by Algorithm I, Algorithm IIa and Algorithm IIb.

Algorithm II was tested numerically for a system with $N=10^4$ and $T=10^8$. The configuration of the system is the same as that which appears in FIG. 1, except the width W of the system is now 17 times wider with a total of 10200~$10^4$ atoms. Each time step is 0.012 fs. The computed transient current using Algorithm I and II are shown in FIG. 8. The purpose of this calculation is to test the computational complexity only. All that needs to be done is to compute, $$S(\omega_T^l) = \omega_T^{-l} \sum_{j=0}^{N^2-1} \frac{u_j(1-d_j^T)}{(1/\omega_T)^l - d_j}, \quad (19)$$

using FMM and then taking FFT to obtain $I(t_j)$ where $u_j$ and $d_j$ have been defined just before Eq. (18). Note that $u_j$ has been obtained in the time independent calculation. If $(1/\omega_T)^j$ and $d_j$ in Eq. (19) are uniformly distributed on the complex plane, the FMM can be done much faster. However, as shown in FIG. 6 and FIG. 7, the unit distribution of $(1/\omega_T)^j$ and $d_j$ are highly non-uniform in this case. Actually, $(1/\omega_T)^j$ are distributed non-uniformly along the circle (FIG. 6) while $d_j$ are distributed in a sector of unit circle (FIG. 7). This makes the calculation more difficult. For $N=10^4$ and $T=N^8$, it was determined that the optimum number of levels in FMM is 10. With 10 levels in FMM, over 60% of the CPU time was spent on the direct sum in the FMM calculation. Using a single core, it took 3,400s to finish the time dependent part of calculation and about 90% of the CPU time was spent on FMM. For comparison, it took 33,800s to perform the time independent calculation. This shows that the algorithm II is of order O(1) if $T<N^2$.

FIG. 6 shows the testing of the algorithm IIa, which is suitable for T=N and the algorithm IIb designed for $T=N^2$, against the algorithm I. For T<N, the results of the algorithm I, the algorithm IIa and the algorithm IIb are on top of each other. For T>N, the calculation was done for $T=N^2$. FIG. 6, only shows the results for T<40,000. There is no significant feature in the transient current plot beyond that.

FIG. 7 shows the distribution of $d_j$ on the complex plane.

FIG. 8 shows the transient current calculated by Algorithm I, Algorithm IIa and Algorithm IIb, IIa and IIb refer to the cases with FMM methods targeting T=N and $T=N^2$, respectively.

In summary, the exact solution of the algorithm for the transient current always contains time dependent parts. According to the present invention the expression for the current is separated so that, e.g.: for a function f=f(t,x) that depends on time t and space x, it is separated into two part so that f=g(t)h(x). Thus, h(x) can be calculated first, which is a very complicated function involves many multiplications. Eventually, for any time t, the h(x) only needs to be computed once.

In addition, the major difference between Algorithm I and II is that for the expression f=g(t)h(x), in algorithm I the multiplication is performed directly; but, for algorithm II, FFT and FMM are adopted to further speed up the multiplication between g(t) and h(x).

While the present invention has been particularly shown and described with reference to preferred embodiments thereof; it will be understood by those skilled in the art that various changes in form and details may be made therein without departing from the spirit and scope of the invention.

The invention claimed is:

1. A computer-implemented method of transient current evaluation to determine a step pulse response time and peak transient current of a nano-chip in nano electronics, comprising the steps of:
   receiving in the computer Hamiltonians of the nano-chip before and after the transient evaluation, $H_{eq}$, $H_{neq}$;
   receiving in the computer self-energy of leads of the nano-chip formed by using a complex absorbing potential (CAP);
   receiving in the computer eigenstates and eigen-energies of the nano-chip;
   receiving in the computer expanded Fermi functions formed using the Pade spectrum decomposition (PSD) method;
   constructing, using code executing within the computer, an equation of transient current which is beyond the wideband limit (WBL) from the eigenstates and eigen-energies and the expanded Fermi functions based on non-equilibrium Green's function (NEGF) formalism using residue theorem;
   separating the equation into space dependent and time depending components respectively, using code executing within the computer, so that it is of a form $I(t)=I_t(I_o, V_m(t), M_n)$, for some m and n such that it is a function composed of time dependent Vandermonde matrices $V_m$, and space dependent matrices $I_o$ and $M_n$;
   computing and constructing space dependent matrices $I_o$ and $M_n$ by an optimized matrix multiplication process using code executing within the computer;
   computing the multiplication of $V_m$ and $M_n$ directly, using code executing within the computer;
   summing up all of the contributing parts of I(t) from the multiplication of $V_m$ and $M_n$ and $I_o$ with $l_t$, using code executing within the computer, to form Algorithm I for the transient response, which has a computational complexity of $50N^3+TN^2$, where N is a size of the nano-chip and T is a time step;
   outputting the complete transient response, I(t) over a user-defined time period; and
   applying the transient response to the design of the nano-chip.

2. The method of claim 1 further including the steps of:
   using FMM and FFT methods to compute the multiplication of $V_m$ and $M_n$; and
   summing up all of the contributing parts of I(t) from the multiplication of $V_m$ and $M_n$ and $I_o$ to form Algorithm II, which has a computational complexity of $50N^3+2N^2 \log_2 N$ for $T<N^2$.

3. The method of claim 2, wherein when T=N an Algorithm IIa is formed.

4. The method of claim 2 wherein when T<2N an Algorithm IIb is formed.

5. The method of claim 1 wherein the Hamiltonians, $H_{eq}$, $H_{neq}$ are derived from first-principles or a tight-binding method.

6. The method of claim 5 wherein the first principles of the input step are (DFT), TB.

7. The method of claim 1 further including the step of using the output to design the nano-chip such that melt down is prevented.

8. The method of claim 1 further including the step of using the output to overcome magnetic tunneling junction problems.

9. The method of claim 1 further including the step of using the output to overcome ferroelectric tunneling junction problems.

10. The method of claim 1 wherein the nano-chip is a graphene nanoribbon.

11. The method of claim 1 wherein the computer is a computer workstation.

12. The method of claim 1 wherein the nano-chip is a proposed virtual design and the output is used to design a nano-chip before actual production.

13. A computer-implemented method of transient current evaluation of a nano-chip in response to a step pulse, comprising the steps of:
  receiving in a computer configured to execute code Hamiltonians of the nano-chip, $H_{eq}$, $H_{neq}$;
  receiving in the computer self-energy of leads of the nano-chip formed by using a complex absorbing potential (CAP);
  receiving in the computer eigenstates and eigen-energies of the nano-chip;
  receiving in the computer expanded Fermi functions formed according to the Pade spectrum decomposition (PSD) method;
  constructing, using code executing within the computer, an equation of transient current which is beyond the wideband limit (WBL) from the eigenstates and eigen-energies, as well as the expanded Fermi functions, based on non-equilibrium Green's function (NEGF) formalism using the residue theorem;
  separating, using code executing within the computer, the equation into space dependent and time depending components, respectively, so the equation is of a form $I(t)=1_t(I_o, V_m(t), M_n)$, for some m and n, such that the equation is a function composed of time dependent Vandermonde matrices $V_m$, and time-independent, space-dependent matrices $I_o$ and $M_n$, wherein the space dependent matrices $I_o$ and $M_n$ are formed by an optimized matrix multiplication process and the multiplication of $V_m$ and $M_n$ in the equation is performed directly;
  summing up all of the contributing parts of I(t) from the multiplication of $V_m$ and $M_n$ and $I_o$ with $1_t$, using code executing within the computer, to form an algorithm for the transient response, which has a computational complexity of $50N^3+TN^2$, where N is a size of the nano-chip and T is a time step; and
  outputting the complete transient response, I(t) over a user-defined time period in the form of response time and peak transient current; and
  applying the transient response to the design of the nano-chip.

* * * * *